(12) United States Patent
Nowak et al.

(10) Patent No.: US 9,935,106 B2
(45) Date of Patent: Apr. 3, 2018

(54) MULTI-FINGER DEVICES IN MUTLIPLE-GATE-CONTACTED-PITCH, INTEGRATED STRUCTURES

(71) Applicant: GLOBALFOUNDRIES INC., Grand Cayman, KY (US)

(72) Inventors: Edward J. Nowak, Shelburne, VT (US); Brent A. Anderson, Jericho, VT (US); Robert R. Robison, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/088,874

(22) Filed: Apr. 1, 2016

(65) Prior Publication Data
US 2017/0287911 A1    Oct. 5, 2017

(51) Int. Cl.
| | |
|---|---|
| *H01L 27/092* | (2006.01) |
| *H01L 27/12* | (2006.01) |
| *H01L 29/04* | (2006.01) |
| *H01L 21/8238* | (2006.01) |
| *H01L 21/84* | (2006.01) |

(52) U.S. Cl.
CPC .... *H01L 27/092* (2013.01); *H01L 21/823885* (2013.01); *H01L 21/84* (2013.01); *H01L 27/1203* (2013.01); *H01L 29/045* (2013.01)

(58) Field of Classification Search
CPC .......................... H01L 27/092; H01L 27/1203
See application file for complete search history.

(56) References Cited

U.S. PATENT DOCUMENTS

| | | | |
|---|---|---|---|
| 5,317,175 A | 5/1994 | Throngnumchai | |
| 7,808,082 B2 | 10/2010 | Yang et al. | |
| 7,871,876 B2 | 1/2011 | Anderson et al. | |
| 2004/0119100 A1 | 6/2004 | Nowak et al. | |
| 2005/0224875 A1 | 10/2005 | Anderson et al. | |
| 2007/0148939 A1* | 6/2007 | Chu ................ | H01L 21/823807 438/590 |
| 2012/0090816 A1* | 4/2012 | Bayazitoglu ........... | B23K 26/38 165/72 |
| 2014/0191330 A1* | 7/2014 | Cheng ............. | H01L 21/823431 257/390 |
| 2015/0008574 A1* | 1/2015 | Gohara ................. | H01L 23/473 257/714 |
| 2016/0372316 A1* | 12/2016 | Yang ................... | H01L 27/0924 |

OTHER PUBLICATIONS

Rectangle definition, Wolfram Mathworld, http://mathworld.wolfram.com/Rectangle.html 2017.*

* cited by examiner

*Primary Examiner* — Matthew Reames
(74) *Attorney, Agent, or Firm* — Michael LeStrange; Andrew M. Calderon; Roberts Mlotkowski Safran Cole & Calderon, P.C.

(57) ABSTRACT

The present disclosure generally relates to semiconductor structures and, more particularly, to multi-finger devices in multiple-gate-contacted-pitch, integrated structures and methods of manufacture. The structure includes: a first plurality of fin structures formed on a substrate having a channel surface in a {110} plane; and a second plurality of fin structures formed on the substrate with a channel surface in a {100} plane, positioned in relation to the first plurality of fin structures.

20 Claims, 6 Drawing Sheets

MULTI-FINGER DEVICES IN MUTLIPLE-GATE-CONTACTED-PITCH, INTEGRATED STRUCTURES

FIELD OF THE INVENTION

The present disclosure generally relates to semiconductor structures and, more particularly, to multi-finger devices in multiple-gate-contacted-pitch, integrated structures and methods of manufacture.

BACKGROUND

In semiconductor fabrication, many semiconductor chips are fabricated together on a single wafer. Fabrication of these chips generally involves forming several different structures on the wafer, including wiring layers, active devices and passive devices. These structures can be fabricated using conventional lithography, etching and deposition processes.

Scaling in semiconductor fabrication can be problematic, however, particularly, high-speed complementary metal-oxide semiconductor (CMOS) scaling beyond the 10 nm node. This scaling can be different beyond the 10 nm node because of pressure to lower Vdd due to reliability at very small conductor-to-conductor spaces, e.g., drain-contact-to-gate. These spaces are demanded to enable continued circuit density gains for lower power per function and increased function per die.

Current approaches to reduce some scaling pressure include the use of Vertical Transport CMOS (VTCMOS) structures. VTCMOS includes using uniform layout vertical transistors on pitch. Other approaches to address the scaling problem include horizontal FinFET CMOS structures with p+ and n+ current vectors oriented at 45-degree angles, with respect to one-another, in order to obtain mobility improvement.

SUMMARY

In an aspect of the disclosure a structure comprises: a first plurality of vertical transport fin structures formed on a substrate having a channel surface on a {110} plane, orthogonal to that of the substrate surface, and transport vector in a {110} direction, orthogonal to the plane of the substrate surface; and a second plurality of vertical transport fin structures formed on the substrate with a channel surface in a {100} plane, positioned in relation to the first plurality of fin structures, and the same transport direction as the first plurality of fin structures.

In an aspect of the disclosure a structure comprises: a plurality of first vertical finFET gate structures with a sidewall of a vertical channel region in a {100} plane; and a plurality of second vertical finFET gate structures orthogonal to the plurality of first vertical finFET gate structures. The plurality of second vertical finFET gate structures have a sidewall of a vertical channel region in a {110} plane.

In an aspect of the disclosure a method comprises: forming a first block with side surfaces in a {110} plane; forming a second block with side surfaces in a {100} plane, the first block and the second block being formed from same material; forming at least one p-type finFET device from the first block, with a side surface of a vertical channel region in the {110} plane; forming at least one n-type finFET device from the second block, with a side surface of a vertical channel region in the {100} plane; and forming upper and lower source/drain regions for both the p-type finFET device and the n-type finFET device above and below the channel regions, respectively, by separate epitaxial growth processes for (i) each of the p-type finFET device and the n-type finFET device and (ii) the upper and lower source/drain regions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to multi-finger devices in multiple-gate-contacted-pitch, integrated structures and methods of manufacture. In embodiments, the structures described herein provide for high-speed CMOS scaling beyond the 10 nm node. In more specific embodiments, the structures provided herein provide the advantage of a large driver in vertical transport CMOS for high-speed CMOS scaling. The advantages described herein are accomplished by introducing an integration of multi-finger devices into a multiple-gate-contacted-pitch by forming an integrated structure to enable high-mobility planes in both nMOS and pMOS devices, while improving density.

In embodiments, the structure described herein includes a substrate with multiple fins comprising nFET fins and pFET fin structures having vertical channels in different planes. For example, in embodiments, the pFET fin structures are positioned orthogonal to the nFET fin structures so as to have vertical channels in the {110} plane; whereas, the nFET fin structures have vertical channels in the {100} plane. It should be recognized that this configuration would not be possible with single-plane device architectures. In further embodiments, a physical arrangement of nFET fin structures are provided along a track direction, with the pFET fin structures being orthogonal thereto. Additional features for these further embodiments include a number of fin structures chosen to match the track width of the nFET structures.

In even more specific embodiments, a CMOS structure comprises a substrate (with a surface in the {110} plane), with one or more vertical transport fin structures disposed on the substrate with vertical channel surfaces on the {100} and {110} planes. That is, a first set of fin structures comprise vertical channel surfaces in {100} plane; whereas, a second set of fin structures comprise vertical channel surfaces in the {110} plane. Also, in exemplary embodiments, the first set fin structures comprise n-type MOSFET and the second set of fin structures comprise a p-type MOSFET. In additional embodiments, the first set of vertical fin structures are parallel to one another and comprise surfaces along a track dimension, and the second set of vertical fin structures are orthogonal to the first set of parallel fins. The number of second fin structures fills the space encompassing the length of the set of first fin structures thus forming a dense circuit.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
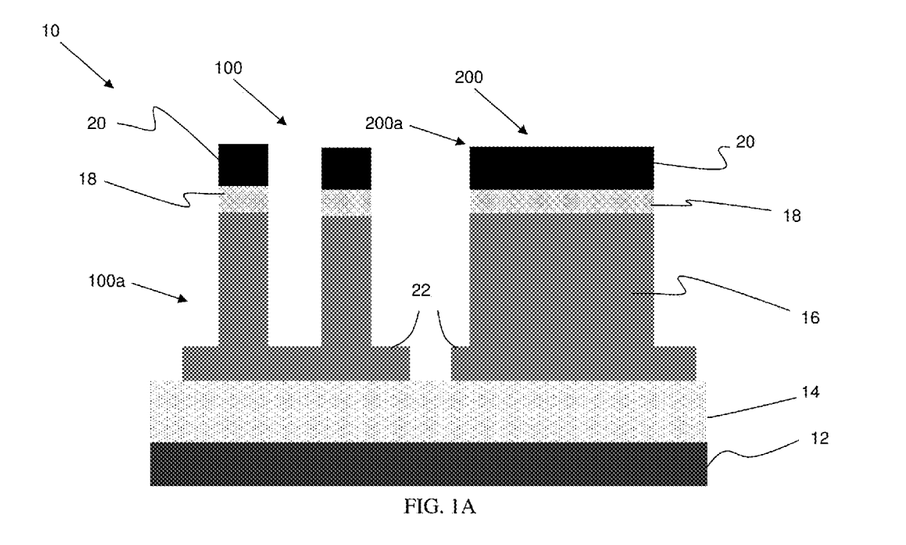
FIG. 1A shows a cross-sectional view of a structure and respective fabrication processes in accordance with aspects of the present disclosure.
Figure 1B:
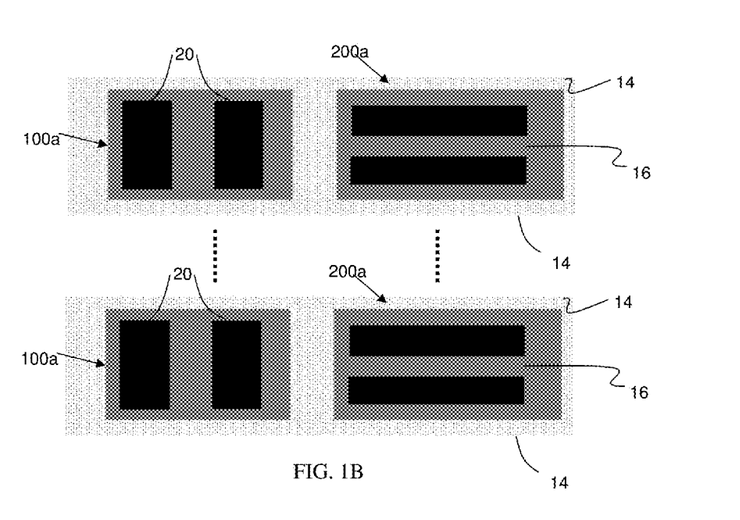
FIG. 1B shows a plan view of the structure of FIG. 1A.

FIG. 1A shows a cross-sectional view of a structure and respective fabrication processes in accordance with aspects of the present disclosure; whereas, FIG. 1B shows a plan view of the structure of FIG. 1A. More specifically, the structure 10 includes a substrate 12 which can be any suitable wafer, e.g., silicon; although other materials are contemplated herein. The substrate 12 can include a surface in the {110} plane. An isolation layer 14 can be formed on the substrate 12 using, e.g., junction isolation in the bulk semiconductor wafer, or, a dielectric by conventional deposition methods. For example, the isolation layer 14 can be formed by a chemical vapor deposition (CVD) process. In alternative embodiments, the isolation layer 14 can be an oxide layer bonded to the substrate 12 as should be understood by those of skill in the art such that no further explanation is required herein. In embodiments, the isolation layer 14 can be any appropriate isolation material such as, e.g., SiO2, among other suitable examples. Semiconductor material 16 is provided on the isolation layer 14. In embodiments, the semiconductor material can be any suitable material such as Si or SiGe, among other suitable semiconductor materials.

In embodiments, the substrate 12, isolation layer 14 and semiconductor material 16 can be a silicon-on-insulator (SOI) substrate, with the isolation layer 14 being a buried oxide layer (BOX). The SOI can be formed in any conventional manner such as SiMOX or other bonding techniques.

Still referring to FIGS. 1A and 1B, a cap material 18 is deposited on the semiconductor material 16. The cap material 18 can be deposited using conventional CVD processes. In embodiments, the cap material 18 can be made of any suitable material such as, for example, $SiO_2$, $Si_3N_4$, or $SiO_2/Si_3N_4$ bilayer, among other suitable materials. As further shown, a hardmask 20, i.e., a photoresist, is deposited on the cap material 18.

As further illustrated in FIGS. 1A and 1B, the structure is patterned to form blocks 100, 200. In embodiments, the blocks 100, 200 are formed using conventional etching processes. For example, a resist is formed over the hardmask 20, and exposed to energy (light) to form openings. An etching process, e.g., reactive ion etching (RIE), is performed through the openings with selective chemistries to the underlying materials to form the blocks 100, 200. In embodiments, the etching will stop on the isolation layers 14. The blocks are provided with vertical surfaces in the {100} and {110} directions, e.g., block 100 is provided with a vertical surface in the {110} plane and the block 200 is provided with a vertical surface in the {100} plane.

As further shown in FIGS. 1A and 1B, the blocks 100, 200 are subsequently used to form a plurality of vertical transport fin structures 100a, 200a, respectively. In embodiments, the fin structures 100a (p-type structures) are formed with vertical surfaces in the {110} direction; whereas, the fin structures 200a (n-type structures) are formed with vertical surfaces in the {100} direction. The fin structures 200a will have a same transport direction as the fin structures 100a. By having a dual plane with a {110} and {100} orientation, both PFETs and NFETs can be optimized in accordance with the embodiments described herein.

In embodiments, the fin structures 100a, 200a can be formed using conventional sidewall image transfer (SIT) processes. For example, in the SIT technique, a mandrel is formed on the hardmask 20 using conventional deposition processes. In an example of a SIT technique, the mandrel material is different than the hardmask material 20, e.g., $SiO_2$. A resist is formed on the mandrel material, and exposed to light to form a pattern (openings). A RIE is performed through the openings to form the mandrels. In embodiments, the mandrels can have different widths and/or spacing depending on the desired dimensions between the fin structures 100a, 200a. Spacers are formed on the sidewalls of the mandrels which are preferably material that is different than the mandrels, and which are formed using conventional deposition processes known to those of skill in the art. The spacers can have a width which matches the dimensions of the fin structures 100a, 200a, for example. The mandrels are removed or stripped using a conventional etching process, selective to the mandrel material. An etching is then performed within the spacing of the spacers to form the sub-lithographic features of the fin structures 100a, 200a.

In embodiments, the etching process which forms the fin structures 100a, 200a will not completely etch or remove the semiconductor material 16. That is, the etching process, e.g., RIE using different chemistries for the different underlying materials, will only etch partially through the semiconductor material 16. In this way, semiconductor material will remain at the bottom of the structure, forming an overhang or island feature 22. This material can advantageously be used to form lower source/drain regions as described herein. And, by etching into the blocks in orthogonal directions, the fin structures can be formed with vertical sidewalls in different planes, e.g., {110} surfaces and {100} surfaces, thus optimizing performance characteristics for both the n-type device and the p-type device.

As further shown in FIG. 1B, it should be noted that any number of fin structures 100a, 200a can be formed depending on the desired layout and required density. For example, the number of fin structures can be increased to match a track width; that is, the number of fin structures 200a can fill the space along the length of the fins structures 100a thus forming a dense circuit (or vice versa). By way of illustrative example, in embodiments, the number of fin structures 100a, 200a can be increased so as to form a large driver made of a first set of parallel vertical fin structures with surfaces along a track dimension, and a second set of parallel vertical fin structures orthogonal to the first set of fin structures. As currently illustrated, the fin structures are arranged with sidewalls in the {110} and {100} planes.

Figure 3:
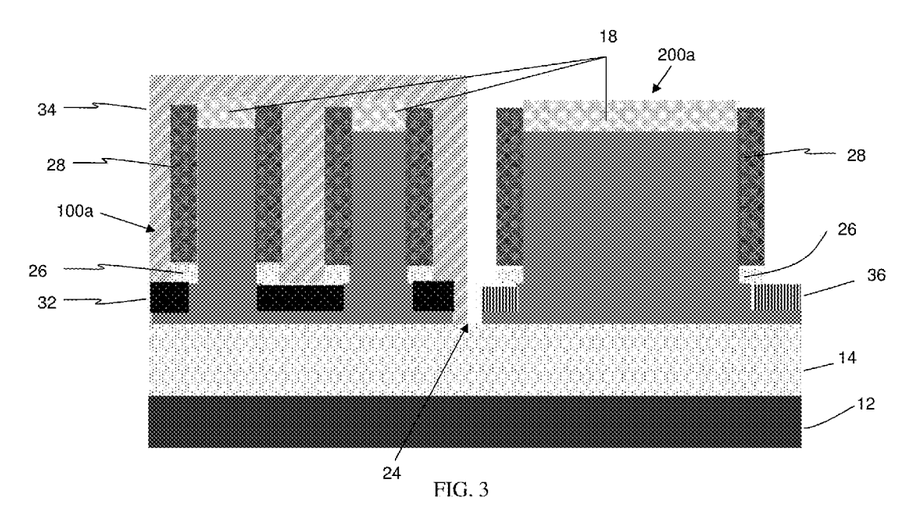
FIG. 3 shows a cross-sectional view of formation of lower source/drain regions on fin structures with vertical surface in a second plane, and respective fabrication processes in accordance with aspects of the present disclosure.
Figure 9:
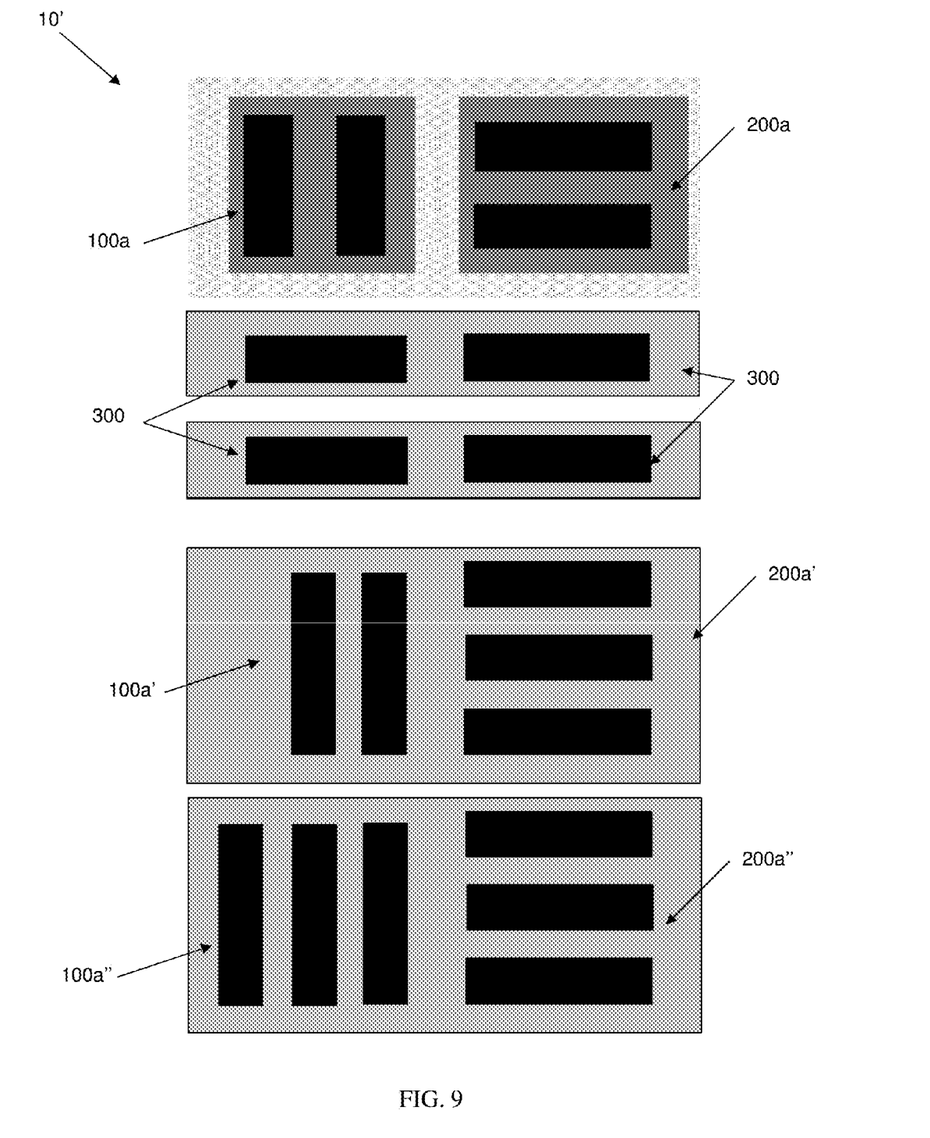
FIG. 9 shows alternative layouts of vertical transport fin structures in accordance with additional aspects of the structures described herein.

Also, as should be understood by those of ordinary skill in the art, the plan view of FIG. 3 shows two pitches (instances) of first-polarity vertical transport fins (e.g., fins 200a) which coincides with the width of the orthogonal, second-polarity vertical transport fins (e.g., fins 100a) (which may include one or more instances or pitches). More specifically, in FIG. 3, it is shown how two periods of first-plane pitches (instances) of first-polarity vertical transport fins (e.g., fins 200a) line up with the width of two columns of the second-plan vertical transport fins (e.g., fins 100a), in periodicity or a continuing repeated fashion. This can be further generalized as shown in FIG. 9, noting the width of the second-plane fins substantially matches a multiple of the first-plane fins pitch as shown for example. These layouts are significant in that unlike fins provided only in a single orientation throughout the wafer, the present structure enables high density circuits.

It should thus be generally noted that the layout of the vertical transport fin structures can comprise a first plurality of vertical transport fin structures comprising n-rows of vertical transport fins of a given periodicity and a second plurality of vertical transport fins structures comprising m-rows of fins of fin length such that the total fin perimeter of the first and second vertical transport fins is in a ratio to achieve approximately equal drive strength of the first set of fins and the second set of fins. In embodiments, the perimeter ratio between the two fins layouts 100a and 200a can be between 0.8 and 1.2.

Figure 2:
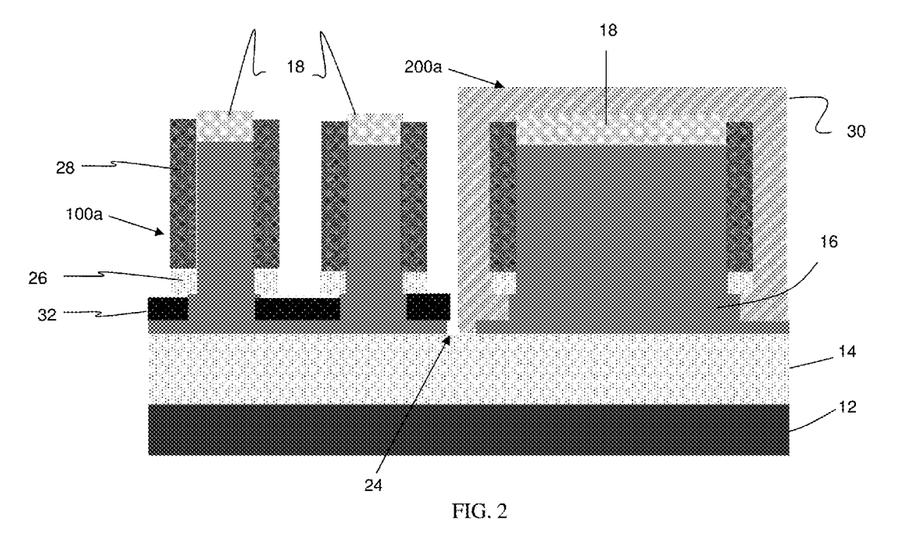
FIG. 2 shows a cross-sectional view of formation of lower source/drain regions on fin structures with vertical surface in a first plane, and respective fabrication processes in accordance with aspects of the present disclosure.

FIG. 2 shows a cross-sectional view of formation of lower source/drain regions on fin structures with vertical surface in a first plane, and respective fabrication processes in accordance with aspects of the present disclosure. In FIG. 2, an oxide material 26 is deposited over the islands of silicon material 22. Prior to depositing the oxide material 26, the hardmask 20 is removed using a conventional stripant, e.g., oxygen ashing. In embodiments, the oxide material 26 is then blanket deposited on the structure including on the isolation material 14 between the remaining silicon material 22, e.g., within spaces 24 between the islands. In embodiments, the oxide material 26 can be deposited using a conventional deposition process, e.g., CVD, followed by a chemical mechanical polish (CMP) and etch back process to reveal the upper portions of the fin structures 100a, 200a. In embodiments, the thickness of the oxide material (after the etch back) can be about 5 nm to about 15 nm; although, other dimensions are also contemplated by the present disclosure.

Subsequent to the oxide deposition and etching processes described herein, spacers 28 are formed on sidewalls of the fin structures 100a, 200a. As illustrated in FIG. 2, for example, the spacers 28 can be deposited on the sidewalls of the fin structures 100a, 200a, and any oxide material 26 remaining on the silicon material 22. In embodiments, the spacers 28 can be a nitride material, e.g., $SiN_4$ or an oxide material, among other examples.

Still referring to FIG. 2, after the deposition process, an anisotropic etching process can be performed to remove the spacer material from horizontal surfaces of the structure, leaving the nitride material on the oxide material 26 and vertical sidewalls of the fin structures 100a, 200a. In embodiments, a second directional etching process, e.g., anisotropic etching process, can be performed to remove any excess oxide material 26, particularly formed on the isolation layer 14 exposed within the spaces 24. In this way, oxide material 26 only remains under the nitride material.

A mask 30 is deposited about the fin structures 200a (e.g., fin structures with vertical sides in the {100} plane) to protect the fin structures 200a during subsequent processes. For example, the mask 30 will prevent growth of material forming on any semiconductor material which occurs on the unprotected side of the structure. More specifically, while the mask 30 is protecting the fin structures 200a, a doped p+ epi material can be grown on the fin structures 100a forming the lower pFET source/drain regions 32 on the vertical channels of the fin structures 100a, e.g., under the channel region of the fin. In this way, the mask 30 will prevent the epi growth on the sidewalls of the fin structures 200a. Optionally, prior to the epi growth, a limited isotropic etch of exposed semiconductor can be conducted to result in epi growth closer to the fin channel.

FIG. 3 shows a cross-sectional view of formation of lower source/drain regions on fin structures with vertical surface in a second plane, and respective fabrication processes in accordance with aspects of the present disclosure. In particular, in FIG. 3, the mask 30 of FIG. 2 is removed, and a new mask 34 is formed on the fin structures 100a (e.g., fin structures with vertical sidewalls in the {110} plane). In embodiments, the mask 30 can be removed by conventional stripants, e.g., oxygen ashing, etc. Similar to that noted already herein, the mask 34 protects the fin structures 100a during subsequent growth processes. For example, while the mask 34 is protecting the fin structures 100a, a doped n+ epi material can be grown about the fin structures 200a lower forming nFET source/drain regions 36 on the vertical channels of the fin structures 200a. In this way, the mask 34 will prevent the epi growth on the sidewalls of the fin structures 100a. The mask 34 can then be removed using conventional stripants as described herein. Optionally, prior to the epi growth, a limited isotropic etch of exposed semiconductor can be conducted to result in epi growth closer to the fin channel.

Figure 4:
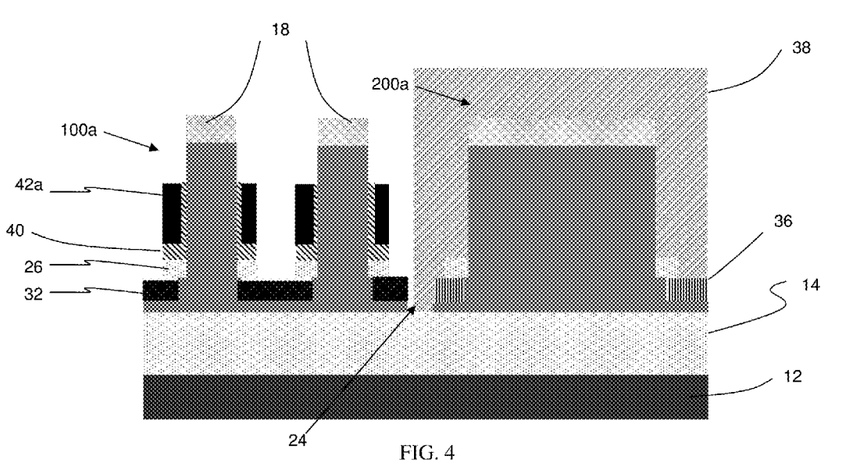
FIG. 4 shows a cross-sectional view of a formation of first gate stacks and respective structures, and respective fabrication processes in accordance with aspects of the present disclosure.

FIG. 4 shows a cross-sectional view of a formation of first gate stacks and respective structures, and respective fabrication processes in accordance with aspects of the present disclosure. More specifically, in FIG. 4, a mask 38 is formed over the fin structures 200a while the gate stack, e.g., gate structures, is formed over the fin structures 100a. For example, in embodiments, nitride material over the sidewalls of the fin structures 100a is removed, and a gate dielectric 40 is formed over the sidewalls of the fin structures 100a. In embodiments, the gate dielectric 40 can be a high-k material such as, e.g., $HfO_2$ films, deposited using atomic layer deposition (ALD) processes.

Still referring to FIG. 4, in embodiments, the gate dielectric 40 will be initially deposited over the remaining oxide material 26 and about the entirety of the fin structures 100a. Workfunction metals 42a are then formed over gate dielectric 40. In embodiments, the workfunction metals 42a can be any metals, depending on the desired performance characteristics of the device. For example, the workfunction metals can comprise TiN, Ti, TiC, Al, deposited by conventional CVD processes, and subsequently filled with W. The deposition processes are followed by a directional anisotropic etch which removes any excess gate dielectric material 40 and workfunction metals 42a on horizontal surfaces of the structure, leaving the dielectric material 40 and workfunction metals 42a on the vertical surfaces of the fin structures, e.g., the vertical channel region.

In embodiments, the gate material 40 and workfunction metals 42a can be over-etched to remove any excess material from within the spaces 24 over the insulator layer 16, e.g., between the islands 22. This over-etching will also result in a recessing of the gate material 40 and workfunction metals 42a about the fin structures 100a. In embodiments, the recess can be about 7 nm to about 15 nm below a top portion of the cap material 18, within a channel region; although other dimensions are also contemplated by the present invention.

Figure 5:
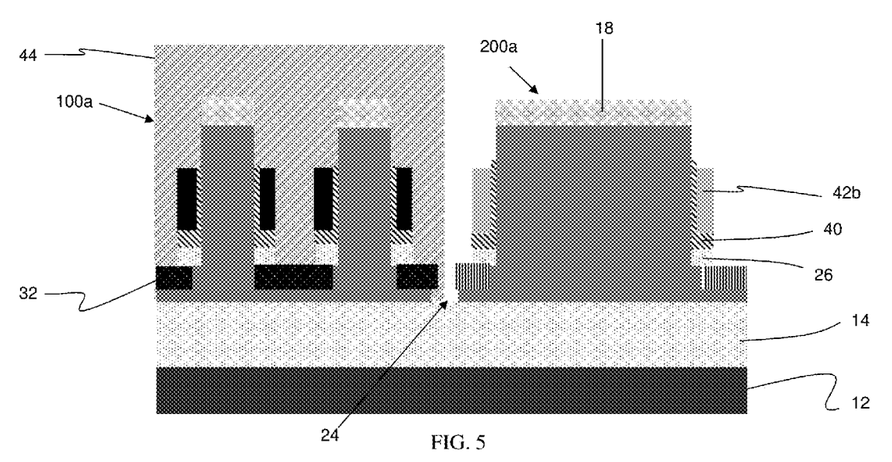
FIG. 5 shows a cross-sectional view of a formation of second gate stacks and respective structures, and respective fabrication processes in accordance with aspects of the present disclosure.

In FIG. 5, the mask 38 is removed over the fin structures 200a and a mask 44 is formed over the fin structures 100a. In this way, a gate stack, e.g., gate structures, can be formed over the fin structures 200a. For example, in embodiments, nitride material over the sidewalls of the fin structures 200a is removed, and a gate dielectric 40 is formed over the sidewalls of the fin structures 200a. As already described herein, the gate dielectric 40 can be a high-k material such as, e.g., HfO$_2$ films, deposited using atomic layer deposition (ALD) processes.

Still referring to FIG. 5, in embodiments, the gate dielectric 40 will be initially deposited over the remaining oxide material 26 and about the entirety of the fin structures 100a. Workfunction metals 42b are then formed over gate dielectric 40. In embodiments, the workfunction metals 42b can be any metals, depending on the desired performance characteristics of the device as already described herein. The deposition processes are followed by a directional anisotropic etch which removes any excess gate dielectric material 40 and workfunction metals 42b over the gate structures 200a.

In embodiments, the gate material 40 and workfunction metals 42a can be over-etched to remove any excess material from within the spaces 24, e.g., between the islands 22. This over-etching will also result in a recessing of the gate material 40 and workfunction metals 42a about the fin structures 200a, leaving the dielectric material 40 and workfunction metals 42b on the vertical surfaces of the fin structures over the channel region, e.g., the vertical channel region. In embodiments, the recess can be about 7 nm to about 15 nm below a top portion of the cap material 18; although other dimensions are also contemplated by the present invention. The masking material can then be removed using conventional processes as described herein.

Figure 6:
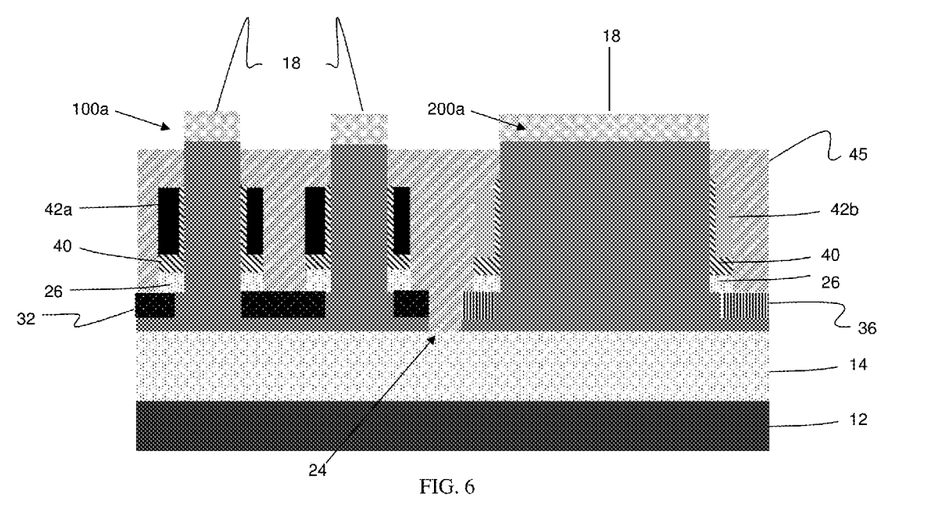
FIG. 6 shows a cross-sectional view of cap structures on the gate stacks, amongst other features, and respective fabrication processes in accordance with aspects of the present disclosure.

FIG. 6 shows a cross-sectional view of formation of cap structures on the gate stacks, amongst other features, and respective fabrication processes in accordance with aspects of the present disclosure. In FIG. 6, an interlevel dielectric material (ILD) 45, e.g., oxide material, is deposited on the structure, e.g., over exposed surfaces. The ILD 45 can be deposited by a conventional CVD process. The ILD 45 is then planarized by a CMP process, followed by an etch back process to partially or fully expose the cap material 18. Specifically, the ILD 45 can be etched back to below a top surface of the cap material 18 or completely below the cap material 18.

Figure 7:
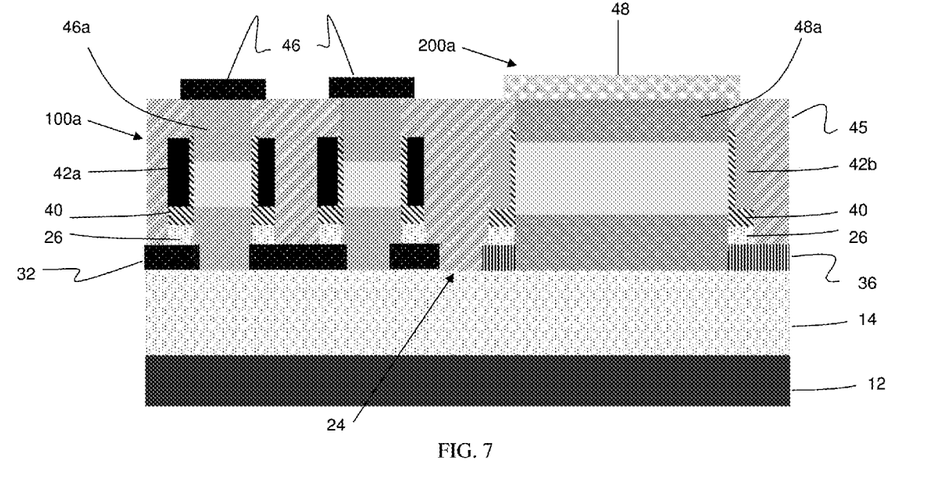
FIG. 7 shows a cross-sectional view of the gate stacks with gate source/drain epitaxial overgrowth and respective fabrication processes in accordance with aspects of the present disclosure.

FIG. 7 shows the formation of upper source/drain regions 46, 48 on the fin structures 100a, 200a in accordance with aspects of the present disclosure. For example, after removal of the cap material 18, a mask is formed over the fin structures 200a, followed by a selective growth of doped p+ epi which forms the top source/drain regions 46 over the fin structures 100a. The mask will prevent the growth of the epi material over the fin structures 200a. In embodiments, the doped p+ epi can be boron. In embodiments, the doped p+ epi and underlying doped material of the lower source/drain region 32 results in outdiffusion regions 46a into the fin structures 100a.

As further shown in FIG. 7, an n+ epi material can be grown over the fin structures 200a to form the upper or top source/drain regions 48 in accordance with aspects of the present disclosure. Similar to the selective growing of p+ epi for the top source/drain regions 46 over the fin structures 100a, a mask is deposited to protect the fin structures 100a followed by a selective growth of doped n+ epi to form top source/drain regions 48 over the fin structures 200a. The mask will prevent the growth of the epi material over the fin structures 100a. In embodiments, the doped n+ epi can be phosphorous or arsenic and with the underlying doped region 36 can form outdiffusion regions 48a into the fin structures 200a. Accordingly, the out-diffusion of n+ and p+ regions will occur to form gate/source and gate/drain overlap regions 46a, 48a in the respective fin structures 100a, 200a.

In this way, it is now possible to form a plurality of first vertical finFET gate structures with a vertical channel region in a {100} plane. The first vertical finFET gate structures can be nFET devices. Also, a plurality of second vertical finFET gate structures can be provided orthogonal to the plurality of first vertical finFET gate structures. The plurality of second vertical finFET gate structures have a vertical channel region in a {110} plane and can be, e.g., pFET devices.

Figure 8:
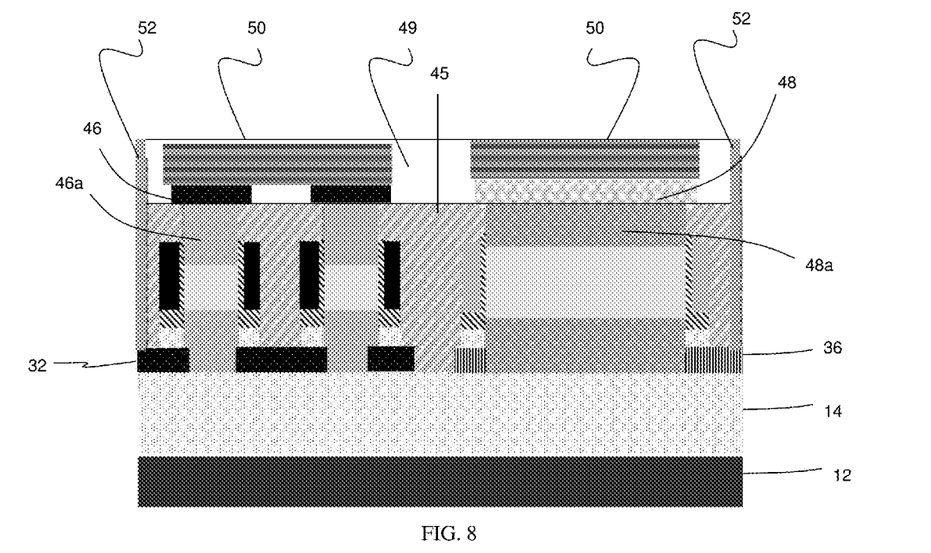
FIG. 8 shows a cross-sectional view of vertical finFET structures with contacts and wirings, and respective fabrication processes in accordance with aspects of the present disclosure.

FIG. 8 shows a cross-sectional view of vertical finFET structures with contacts and wirings, and respective fabrication processes in accordance with aspects of the present disclosure. Referring to FIG. 8, a dielectric material 49 is deposited over the upper source/drain regions 46, 48. In embodiments, the dielectric material 49 is an interlevel dielectric material (ILD) deposited by a conventional deposition process, e.g., CVD. The ILD material 49 can be any suitable dielectric material, for example SiO$_2$, among other examples.

In embodiments, the ILD material 49 can be etched to form trenches, exposing the underlying the upper source/drain regions 46, 48. A metal material 50 can then be deposited within the trenches directly on the source/drain regions 46, 48, followed by a planarization process to the ILD material 49, e.g., CMP, to form upper source/drain contacts and wiring layers. The deposition process can include, e.g., CVD.

Also, contacts 52 can be formed to the lower source/drain regions 32, 36 using conventional CMOS processes. The contacts 50, 52 can be any appropriate metal material such as copper, aluminum, etc, deposited within trenches formed by lithography and etching processes as described herein.

FIG. 9 shows alternative layouts of vertical fin structures in accordance with additional aspects of the structures described herein. Generally, FIG. 9 shows several rows of fins in a layout such that regardless of the amount of vertical fin structures used in a row, will have n+1 pitches (instances) of first-polarity vertical transport fins (e.g., fins 200a) which coincides with the width of the orthogonal, second-polarity vertical transport fins (e.g., fins 100a). More specifically, in FIG. 9, in a first row, two pitches (instances) of first-polarity vertical transport fins (e.g., fins 200a) coincides with the width of the orthogonal, second-polarity vertical transport fins (e.g., fins 100a) (also having two pitches). In second and third rows, vertical transport fins 300 are provided in a conventional layout, e.g., vertical transport fins 300 are both provided in the same plane, in a single pitch. In a fourth row, three pitches (instances) of first-polarity vertical transport fins (e.g., fins 200a') coincides with the width of the orthogonal, second-polarity vertical transport fins (e.g., fins 100a') (having two pitches) (instances). In a fifth row, three pitches (instances) of first-polarity vertical transport fins (e.g., fins 200a") coincides with the width of the orthogonal, second-polarity vertical transport fins (e.g., fins 100a") (having three pitches(instances)).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
a first plurality of vertical transport finFET structures formed on a substrate having a channel orthogonal to that of a substrate surface; and
a second plurality of vertical transport finFET structures formed on the substrate with a channel, positioned in relation to the first plurality of finFET structures, and a same transport direction as the first plurality of finFET structures, wherein the second plurality of vertical transport finFET structures are positioned orthogonal in relation to the first plurality of vertical transport finFET structures such that the channel of the first plurality of vertical transport finFET structures is along a width of the second plurality of vertical transport finFET structures.
2. The structure of claim 1, wherein the substrate has a {110} surface.
3. The structure of claim 1, wherein the channel surfaces of the first and second plurality of vertical transport finFET structures are vertical channels running along sidewalls of the first and second plurality of vertical transport finFET structures.
4. The structure of claim 1, wherein the first plurality of vertical transport finFET structures are p-type transistors and the second plurality of vertical transport finFET structures are n-type transistors.
5. The structure of claim 4, wherein the first plurality of vertical transport finFET structures comprises n-rows of a given periodicity and the second plurality of vertical transport finFET structures comprises m-rows of fins of fin length forming a ratio to achieve approximately equal drive strength of the first plurality of vertical transport finFET structures and the second plurality of vertical transport finFET structures.
6. The structure of claim 1, wherein the first plurality of vertical transport finFET structures comprise surfaces oriented along a direction and the second plurality of vertical transport finFET structures are positioned along a length of the first plurality of vertical transport finFET structures.
7. The structure of claim 1, wherein:
the first plurality of finFET structures have an upper source/drain region and a lower source/drain region, the lower source region being isolated from gate stack material by an oxide material formed on semiconductor material that formed the first plurality of vertical transport finFET structures; and
the second plurality of finFET structures have an upper source/drain region and a lower source/drain region, the lower source region being isolated from gate stack material by an oxide material formed on semiconductor material that formed the second plurality of vertical transport finFET structures.
8. The structure of claim 7, wherein:
the upper source/drain region and the lower source/drain region of the first plurality of vertical transport finFET structures are provided respectively at an upper portion and lower portion of each of the first plurality of vertical transport finFET structures, with a channel region therebetween; and
the upper source/drain region and the lower source/drain region of the second plurality of vertical transport finFET structures are provided respectively at an upper portion and lower portion of each of the second plurality of vertical transport finFET structures, with a channel region therebetween.
9. The structure of claim 8, wherein the channel regions are oriented in a vertical direction and are covered by a dielectric material and one or more workfunction metals provided between the upper and lower source/drain regions of the first and second plurality of vertical transport finFET structures.
10. The structure of claim 9, wherein the upper source/drain region and the lower source/drain region of the first and second plurality of vertical transport finFET structures are doped epi growth material.
11. The structure of claim 10, further comprising outdiffusion regions extending within the channel region of the first plurality of vertical transport finFET structures and the second plurality of finFET structures, extending downward from the upper source/drain region and upward from the lower source/drain region of the first and second plurality of vertical transport finFET structures.
12. A structure, comprising:
a plurality of first vertical finFET gate structures with a sidewall of a vertical channel region in a {100} plane; and a plurality of second vertical finFET gate structures orthogonal to the plurality of first vertical finFET gate structures, the plurality of second vertical finFET gate structures having a sidewall of a vertical channel region in a {110} plane, wherein the fin structures of the first and second plurality of vertical finFET gate structures are rectangular in a lateral direction.

13. The structure of claim 12, wherein:

the plurality of first vertical finFET gate structures are nFETs and the plurality of second vertical finFET gate structures are pFETs; and the plurality of first and second vertical finFET gate structures each have a vertical channel region along a vertical extent thereof.

14. The structure of claim 13, wherein the plurality of first and second vertical finFET gate structures each have source/drain regions on an upper and lower extent of a fin forming the plurality of first and second vertical finFET gate structures, with the vertical channel region therebetween.

15. The structure of claim 14, wherein the source/drain regions on the upper and lower extent are doped epi material.

16. The structure of claim 15, wherein the doped epi material is grown epi material on the upper and lower extent of the fin forming the plurality of first and second vertical finFET gate structures.

17. The structure of claim 1, wherein at least one of the first plurality of vertical transport fin structures or the second plurality of vertical transport fin structures form a finfet device with a vertical channel.

18. The structure of claim 17, wherein the fin structures of the first and second plurality of vertical transport fin structures are rectangular in a lateral direction.

19. The structure of claim 12, wherein the plurality of first and second vertical finFET gate structures have vertical channels.

20. The structure of claim 19, wherein the plurality of first and second vertical finFET gate structures comprise rectangular fin structures in a lateral direction.

* * * * *